(12) United States Patent
Medvedev

(10) Patent No.: US 11,535,532 B1
(45) Date of Patent: Dec. 27, 2022

(54) SYSTEM AND METHOD OF WATER PURIFICATION AND HYDROGEN PEROXIDE GENERATION BY PLASMA

(71) Applicant: Dmitry Medvedev, Moscow (RU)

(72) Inventor: Dmitry Medvedev, Moscow (RU)

( * ) Notice: Subject to any disclaimer, the term of this patent is extended or adjusted under 35 U.S.C. 154(b) by 417 days.

(21) Appl. No.: 16/932,018

(22) Filed: Jul. 17, 2020

(51) Int. Cl.
*C02F 1/46* (2006.01)
*H01J 37/32* (2006.01)

(52) U.S. Cl.
CPC ........ *C02F 1/4608* (2013.01); *H01J 37/3277* (2013.01); *H01J 37/32082* (2013.01); *H01J 37/32348* (2013.01); *H01J 37/32541* (2013.01); *H01J 37/32899* (2013.01); *C02F 2303/04* (2013.01); *C02F 2305/023* (2013.01); *H01J 2237/338* (2013.01)

(58) Field of Classification Search
CPC ............... C02F 1/4608; C02F 2303/04; C02F 2305/023; H01J 37/32082; H01J 37/32348; H01J 37/32541; H01J 37/3277; H01J 37/32899; H01J 2237/338
See application file for complete search history.

(56) References Cited

U.S. PATENT DOCUMENTS

2020/0407247 A1\* 12/2020 Horikoshi .............. B01J 19/087

\* cited by examiner

*Primary Examiner* — Lessanework Seifu
(74) *Attorney, Agent, or Firm* — Bardmesser Law Group

(57) ABSTRACT

A system for generation of radicals in a liquid (e.g., OH and derivatively $H_2O_2$ in water) by a plasma reactor, including a first electrode having a rod shape or a tubular shape; a dielectric tubular housing coaxial with the first electrode and enclosing the first electrode, and having a gap to the first electrode of 0.3-30 mm; a second electrode on an outside of the dielectric tubular housing and coaxial with first electrode with a gap 0.3-30 mm; a high voltage power supply providing voltage oscillations or pulses of 0.5-30 kV and a frequency 1-50 kHz between the first and second electrodes; and a pump or a Venturi injector on an output of the plasma reactor and a chock valve on an input of reactor for generating a low water pressure in the gap between first and second electrodes so as to generate boiling in the gap.

10 Claims, 9 Drawing Sheets

SYSTEM AND METHOD OF WATER PURIFICATION AND HYDROGEN PEROXIDE GENERATION BY PLASMA

BACKGROUND OF INVENTION

Field of the Invention

The invention is related to liquid treatment by generation of radicals in the liquid, which stimulate chemical reactions, e.g., OH radicals in water for water purification and generation of hydrogen peroxide solution in water for using peroxide solution for oxidation and sterilization.

Description of the Related Art

Utilization of oxidation technologies is a necessary stage of any water purification technology. An oxidation stage is necessary for drinking water treatment that comes from wells or river and lakes, for purification and decontamination of waste water, for recycling, for water purification for swimming pools and aquariums, etc.

There are many oxidation agents that now can be used for water purification. Fortunately, direct chlorination of water is now seldom used because of the evident danger and harmfulness of this technology. Nevertheless modern advanced chlorination technologies that use, for example, hypochlorite, also produce toxic and carcinogenic chlororganic byproducts.

Oxidation technologies which do not use chlorine as the oxidizer are safer, and their utilization for water purification is growing. But even the most popular chlorine-free technologies, like, for example ozonation, have inconveniences and disadvantages, which in turn stimulate development of new alternative oxidation technologies.

First disadvantage of widely used technologies of ozone utilization is the inconvenience of injection ozone from a gas phase into water using injectors and back and gas separation valves, which is not reliable enough and can cause failures and emergencies. Other disadvantages are caused by chemical features of ozone. There is a problem of hard oxidative byproducts of ozone. For example, COD (chemical oxygen demand) of water, which characterizes organic substances in water, can be changed by ozonation only modestly, because of creation of compounds that practically cannot be oxidized by ozone. The best known example of such substances is formaldehyde, which is harmful and has low allowed concentration. Generation of formaldehyde is one of the reason complicating the use of ozonation for water treatment.

Another problem of ozone using as decontamination agent is small life time of ozone in water. This is a reason why after ozonation it is necessary to add other chemicals for water conservation. One more problem is small diluting ability of ozone in water, caused by high concentration of ozone in water under ozonated water surface.

This is the reason for attempts to develop new oxidative agents for water purification and decontamination. One of most advanced technologies is generation of OH radical by pulsed electric discharge in water. Technically, of course, this is not electric discharge in liquid but electric discharge in small bubble of water vapor in water, but the term "plasma in liquid" "plasma in liquid" or "electric discharge in liquid" are the typical short names for this kind of plasma.

In the first stage, due to electric discharge ignition, water molecules are dissociated with creation of OH* radicals. This OH* radical (unlike ion OH—) has extremely high oxidation ability and oxidizes instantly all substances which can be oxidized.

$H_2O \rightarrow OH- + H+$ water dissociation to negative and positive ions in liquid $H_2O \rightarrow OH* + H*$ water dissociation to neutral radicals in plasma Then, during the second stage of reactions, when there are no other substances which can be oxidized radicals OH start react with each other forming hydrogen peroxide $H_2O_2$. These reactions were described by Bruce R Locke, Kai-Yuan Shih 2011 in "Review of the methods to form hydrogen peroxide in electrical discharge plasma with liquid water", *Plasma Sources Sci. Technol.* 20 034006. Hydrogen peroxide can be used as reagent or disinfectant with long life time unlike radical OH.

The OH radical has high oxidation ability, which is much greater than the oxidation ability of a molecular oxidizer like ozone. In practice, OH oxidizes every molecule which can be oxidized even in theory, after one collision including hard oxidized substances which cannot be oxidized by ozone, such as, e.g., formaldehyde or tetrachloromethane. Oxidation goes to the very end and completes without creating byproducts. This feature of the OH radical is a reason for high interest of researchers to methods of generation of OH by pulse electric discharge in liquid.

Regular pulse electric discharges in liquid have low energy efficiency of radical OH generation because reverse reactions of OH decomposition in a gas phase before the moment when they can reach water surface. Energy cost of OH generation in many times more than, for example, ozone energy cost, and such oxidation technology was not compatible with ozone water treatment. To solve this problem there were many attempt to intensify transport of OH from gas to liquid phase water such as, for example, in work of Chobei Yamabe, Taiki Hirohata, Hirotsugu Katanami, Satoshi Ihara "Electrical discharge with bubbles in water and their application-water treatment by cavitation electrical discharge", Department of Electrical Engineering, Saga University, 1 Honjio-machi, Saga 840-8502, Japan. In this work, electric discharge was created in bubbles in fast water flow, but this paper doesn't solve the OH transport problem completely. Another important disadvantage is a short lifetime of electrodes in such kind of electric discharges. Pulsed electric discharge in liquid is well known and has wide utilization for "electric discharge machining".

Temperature of the gas in such an electric discharge is more than 10000° C. and melting of part of the electrodes material is a necessary phenomenon. All attempts to decrease erosion by optimizing electrode shape and liquid flow optimization cannot solve the problem completely. Thus, the life time of the electrodes and OH transport from gas to liquid phase make known oxidation technology based on pulse electric discharge in water incompatible with traditional ozone and chlorine technologies and inhibit broad utilization of this promising approach.

Only using a new approach to creation of electric discharge in water can solve problems of electrode life time and OH transport from gas to liquid phase and make direct generation of OH and hydrogen peroxide from water compatible oxidation technology.

Effective "low-pressure OH radicals reactor generated by dielectric barrier discharge from water vapor" was described in by Li Wang, LunHua Deng, Bao Li, Bo Fang, WeiXiong Zhao, and HuaiLiang Xu in *Physics of Plasmas* 27, 060701 (2020); doi.org/10.1063/5.0006191.

Using a low-pressure rector for generation of OH radicals is interesting from the point of view of OH transportation from the location where it is generated to a location where they can be used. The idea is to increase path length with a pressure decrease and so decrease OH reverse reaction probability because of a decrease in collision frequency.

SUMMARY OF INVENTION

Accordingly, the invention provides a design and conditions for radicals' generation in liquid vapors and transport of the radicals to liquid surface with minimal losses and back reactions (for example, generation of OH radicals in water vapors) and finally generation of hydrogen peroxide in water.

This means that the vapor pressure in which the ignited plasma should be optimized for transport of radicals to the liquid with minimum collisions with each other, which can cause radicals losses.

At the same time, plasma parameters should be optimal for radical generation with minimal energy cost.

To do this, the system includes a reactor chamber connected with a plasma power supply for generation of plasma inside reactor chamber. The reactor chamber has a liquid input and output with a valve for pressure control in input line and sucking liquid pump in output line to generate a low pressure in rector. The pump should provide a low enough pressure for boiling the liquid in reactor chamber, which is stimulated also by additional heating of reactor by plasma.

The power supply provides voltage, current, pulse duration and pulse frequency that are optimal for radicals generation by plasma at liquid vapors at current pressure in reactor.

In one aspect, there is provided a system for generation of radicals in a liquid by a plasma reactor, including a first electrode having a rod shape or a tubular shape; a dielectric tubular housing coaxial with the first electrode and enclosing the first electrode, and having a gap to the first electrode of 0.3-30 mm; a second electrode on an outside of the dielectric tubular housing and coaxial with first electrode with a gap 0.3-30 mm; a high voltage power supply providing voltage oscillations or pulses of 0.5-30 kV between the first and second electrodes; and a pump or a Venturi injector on an output of the plasma reactor and a chock valve on an input of reactor for generating a low water pressure in the gap between first and second electrodes so as to generate cavitation in the gap.

Optionally, the input and the output of the plasma reactor is directed tangentially. Optionally, the first electrode has sharp ridges on its outer surface to distribute plasma inhomogeneities. Optionally, the first electrode has a thread on its outer surface to distribute plasma inhomogeneities. Optionally, multiple plasma reactors are connected in parallel. Optionally, multiple plasma reactors are connected in series. Optionally, the liquid is water. Optionally, the radicals are OH radicals. Optionally, the plasma reactor also generates hydrogen peroxide ($H_2O_2$). Optionally, the second electrode is shaped as a wire spiral, a metal grid, a metal foil or a metal tubular shape.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF ATTACHED FIGURES

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
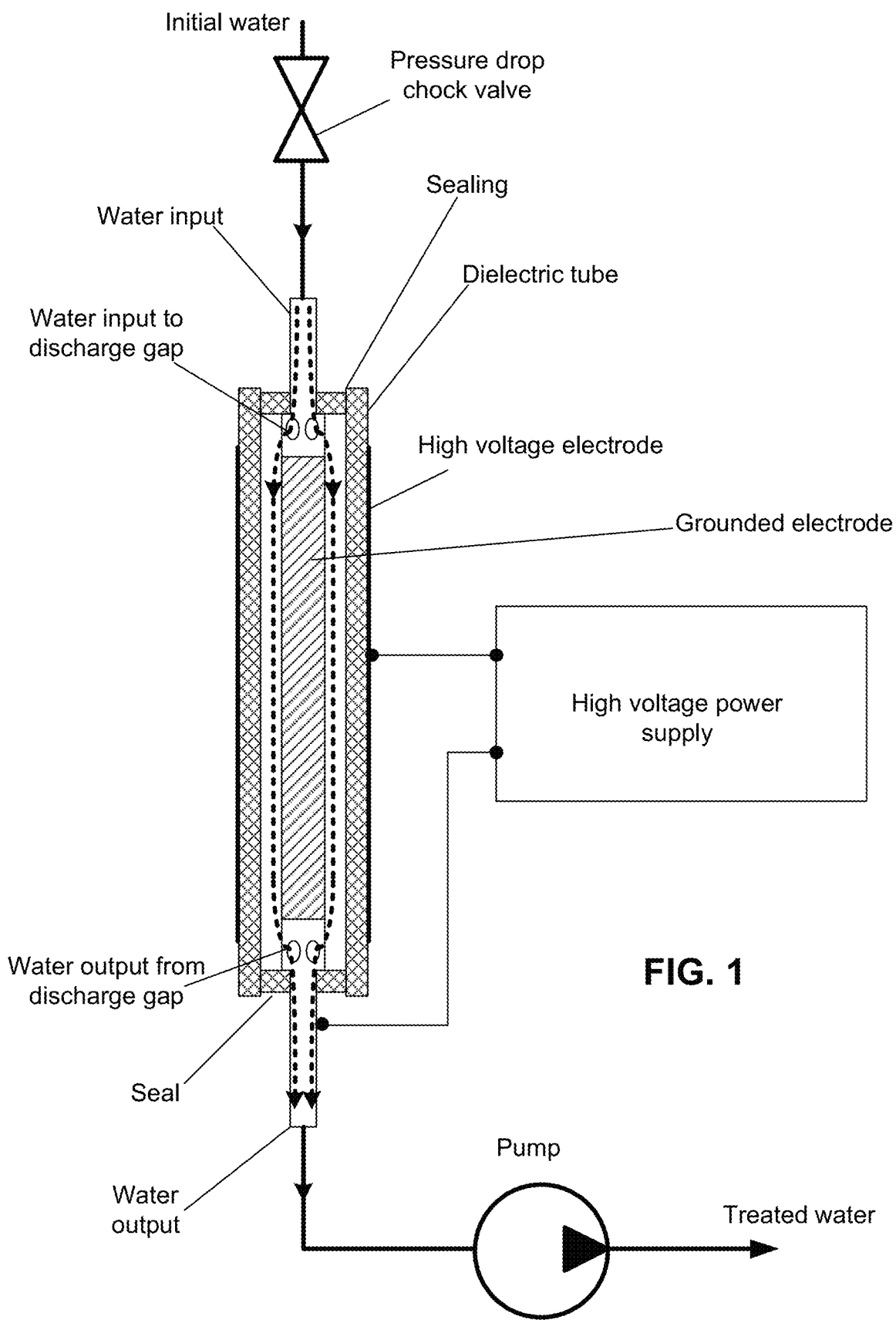
FIG. 1 shows a design of OH generation reactor and a flow chart of reactor connections that can provide reactor operation conditions.

The proposed concept is to organize plasma generation of OH by electric discharge at low pressure close to the water surface and to provide effective generation and transportation of the OH radicals from gas to liquid in a reactor that can be practically used in industry. The proposed reactor (see FIG. 1) includes a dielectric tube with outer high voltage electrode made from metal wire, foil, metal grid or metal tube on outer surface of dielectric tube. Inside the dielectric tube, a grounded electrode is arranged coaxially with the dielectric tube.

The high voltage electrode and the grounded electrode are connected to a high voltage power supply. Between inner surface of dielectric tube and outer surface of grounded electrode there is a several millimeters reactor gap. At the top of tube there is water input that goes to a discharge gap. At the bottom of reactor water goes from the reactor gap to a water output. The output of reactor connects to an input of a water pump, and at the input of reactor a chock valve installed, which can control input water flow, and permits the water pump to create negative pressure in the reactor gap. This negative pressure is controlled by pump capacity and chock valve effective clearing hole. If this pressure will drop up to pressure of water vapor, the water starts to boil, and vapor bubbles appear in the reactor gap.

When high voltage is applied to the high voltage electrode, electric discharge in vapor bubbles can be ignited. This flow setup can provide conditions for effective generation of OH radicals in bubbles, and these radicals can be effectively transported from gas to liquid phase because at low pressure, OH path length is high, diffusion process is fast and number of collision of radicals which can cause reverse reaction is small.

Figure 2:
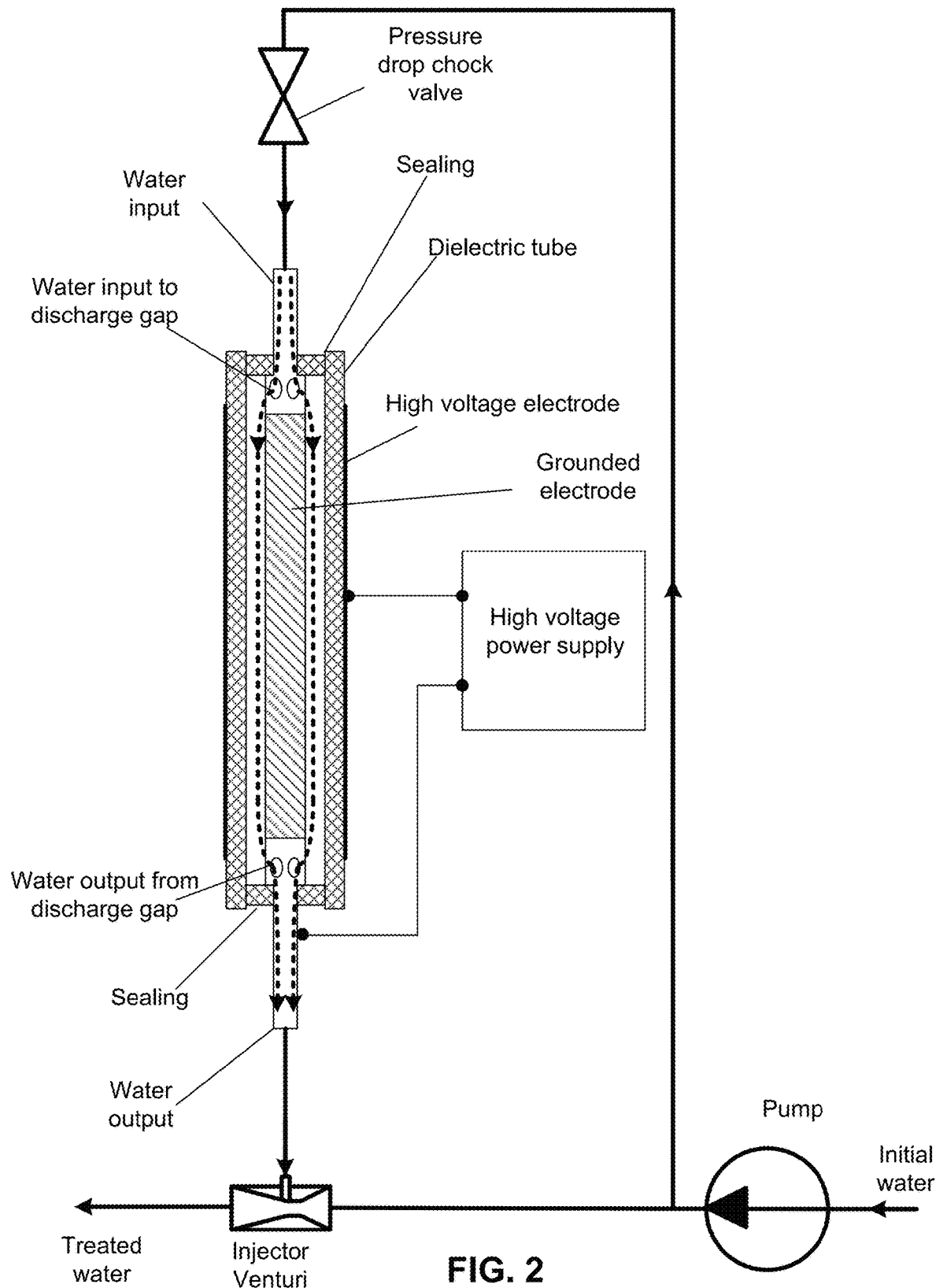
FIG. 2 shows another exemplary design of reactor connection including a Venturi tube.

Instead of direct suction of water by a pump, in some cases a Venturi injector can be used (FIG. 2). In this case requirements for pump resistance to cavitation and chemical reagents are less strict, and the pump can operate in regular operation mode to provide the necessary pressure at the Venturi injector input. Suction input of Venturi injector works in this case for pressure decreasing in reactor like pump suction input. Venturi injector can be made from cavitation and chemical resistive materials and be stable in presence of hydrogen peroxide generated by reactor.

Figure 3:
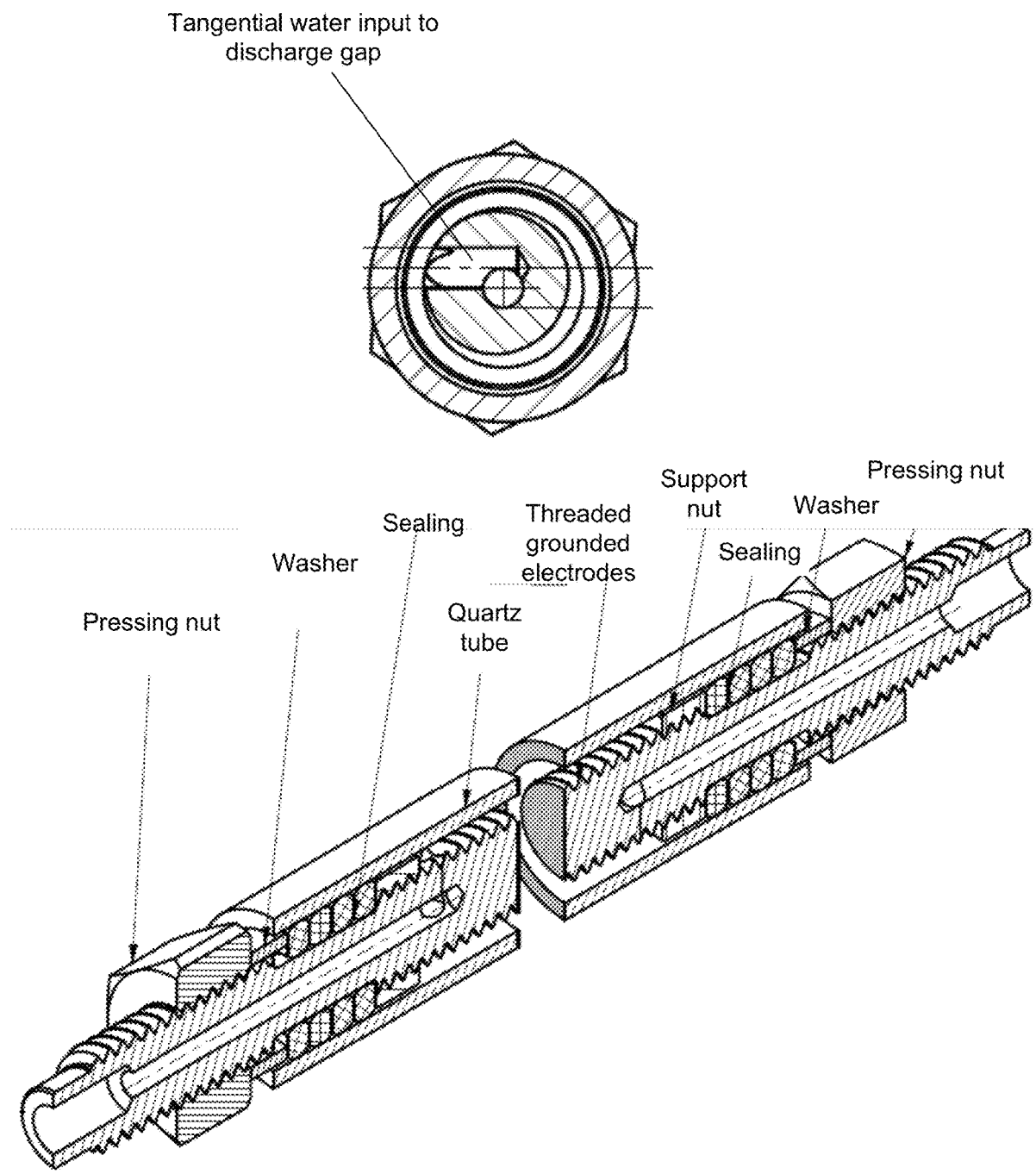
FIG. 3 shows an exemplary design of grounded electrode of rector with sharp thread and tangential water input and output channels of reactor gap.

Another option is to use tangential water input (FIG. 3) to rector gap which can provide better uniformity of water treatment in reactor by better intermixing of water and vapor bubbles and making continues water film on dielectric reactor wall.

Another option is using mechanically sharped internal grounded electrodes to prevent electric discharge attaching to some places of internal electrode by spontaneous overheating of certain points caused by flow or plasma instabilities. A sharp electrode makes it more independent of natural inhomogeneities by creation of multiple artificial inhomogeneities with larger sizes and stimulation of multiple breakdowns from the sharp parts. A threaded electrode can fulfil this function.

Figure 4:
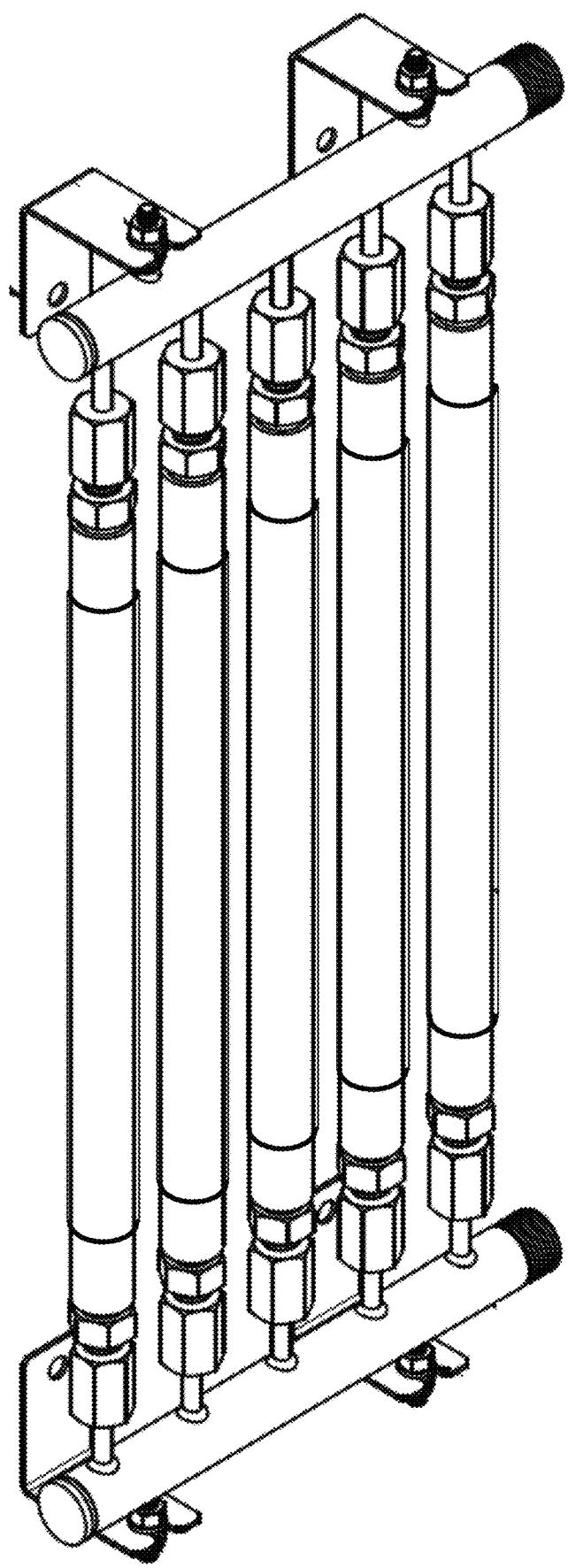
FIG. 4 shows an exemplary parallel connection of several reactors.
Figure 5:
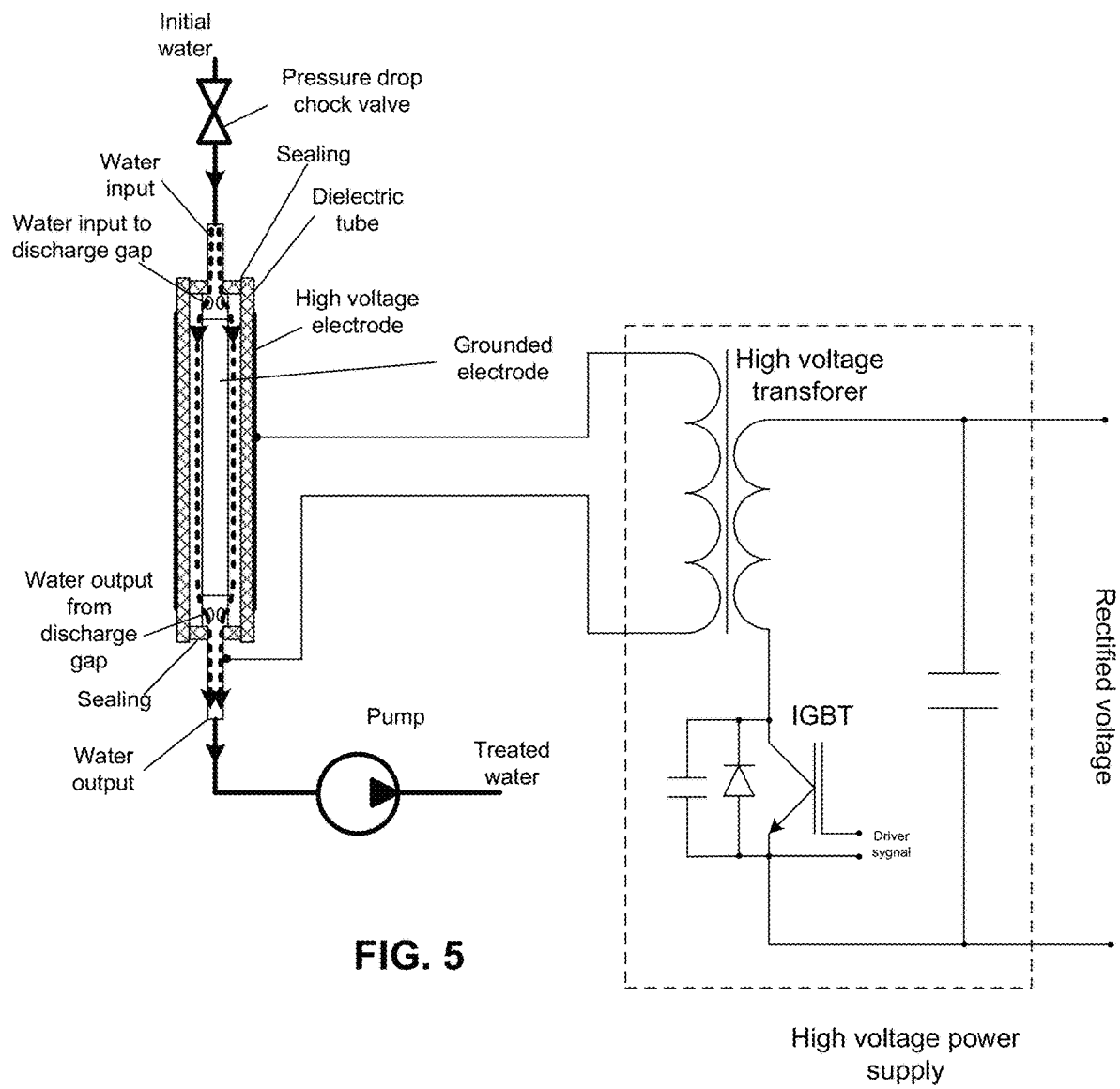
FIG. 5 shows an exemplary power supply based on half-wave fly-back schematic.
Figure 6:
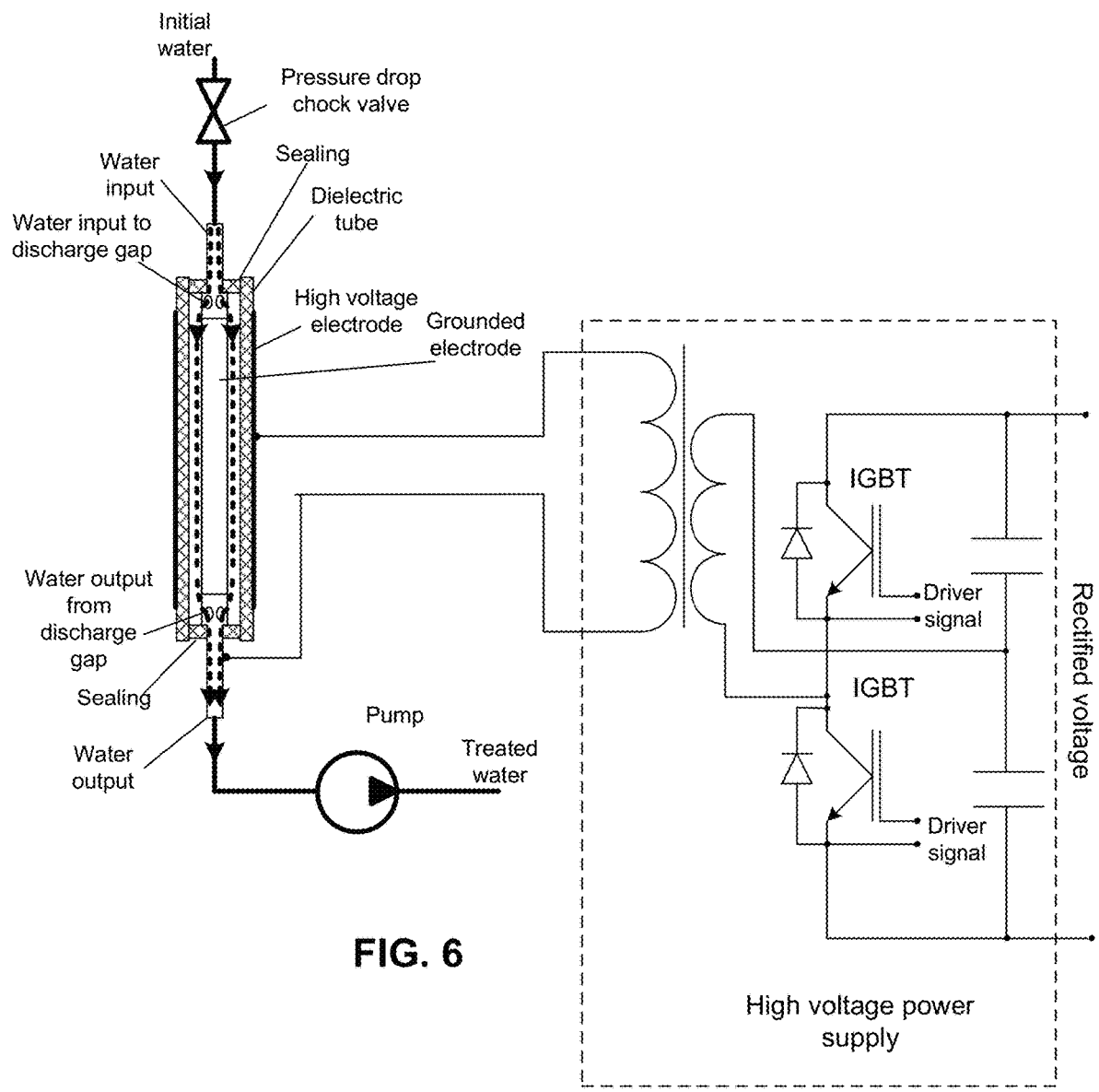
FIG. 6 shows an exemplary power supply based on full-wave push-pull circuit with IGBT semi-bridge.
Figure 7:
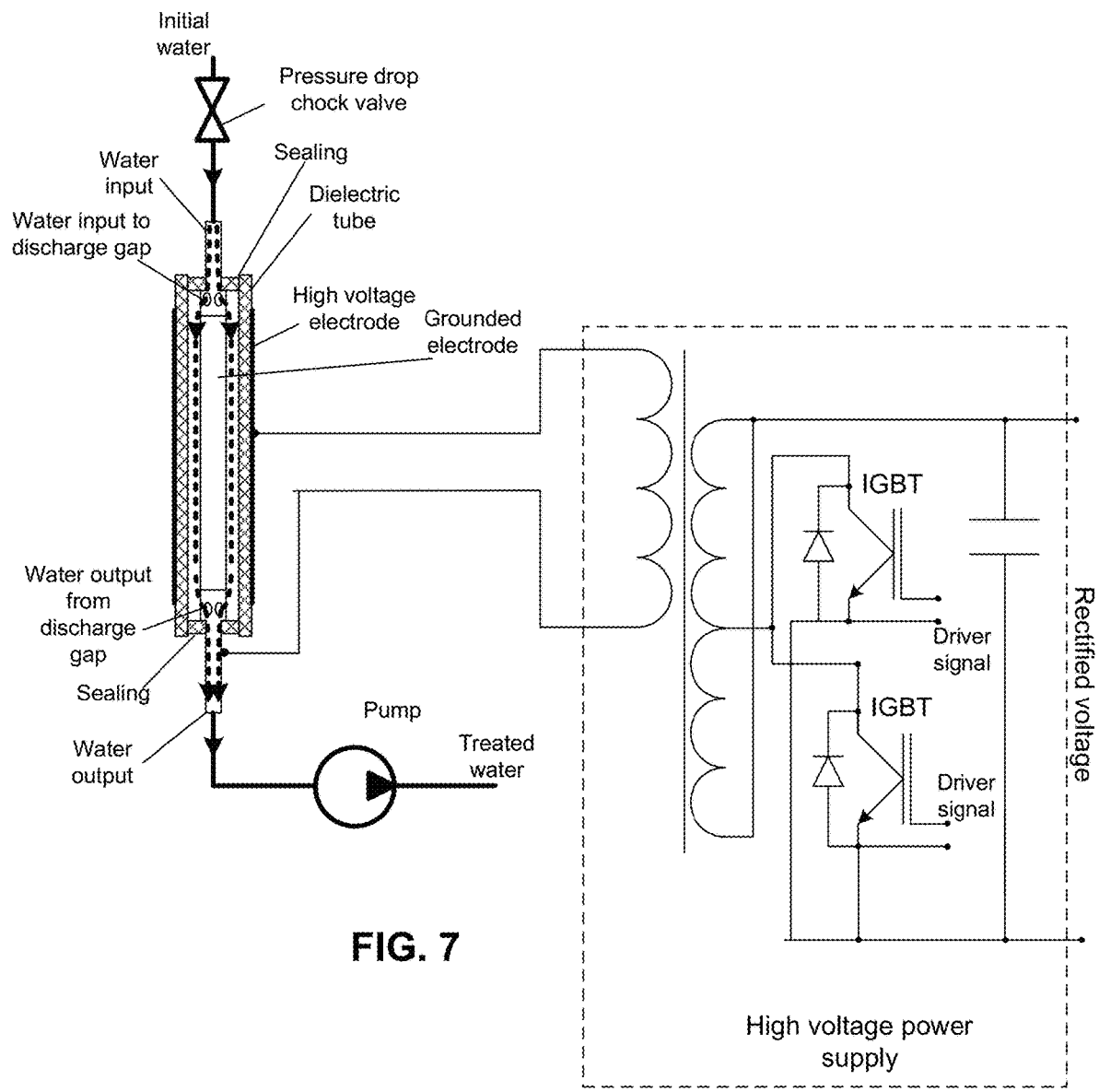
FIG. 7 shows an exemplary power supply based on a full-wave push-pull circuit with IGBT semi-bridge and midpoint transformer primary winding.
Figure 9:
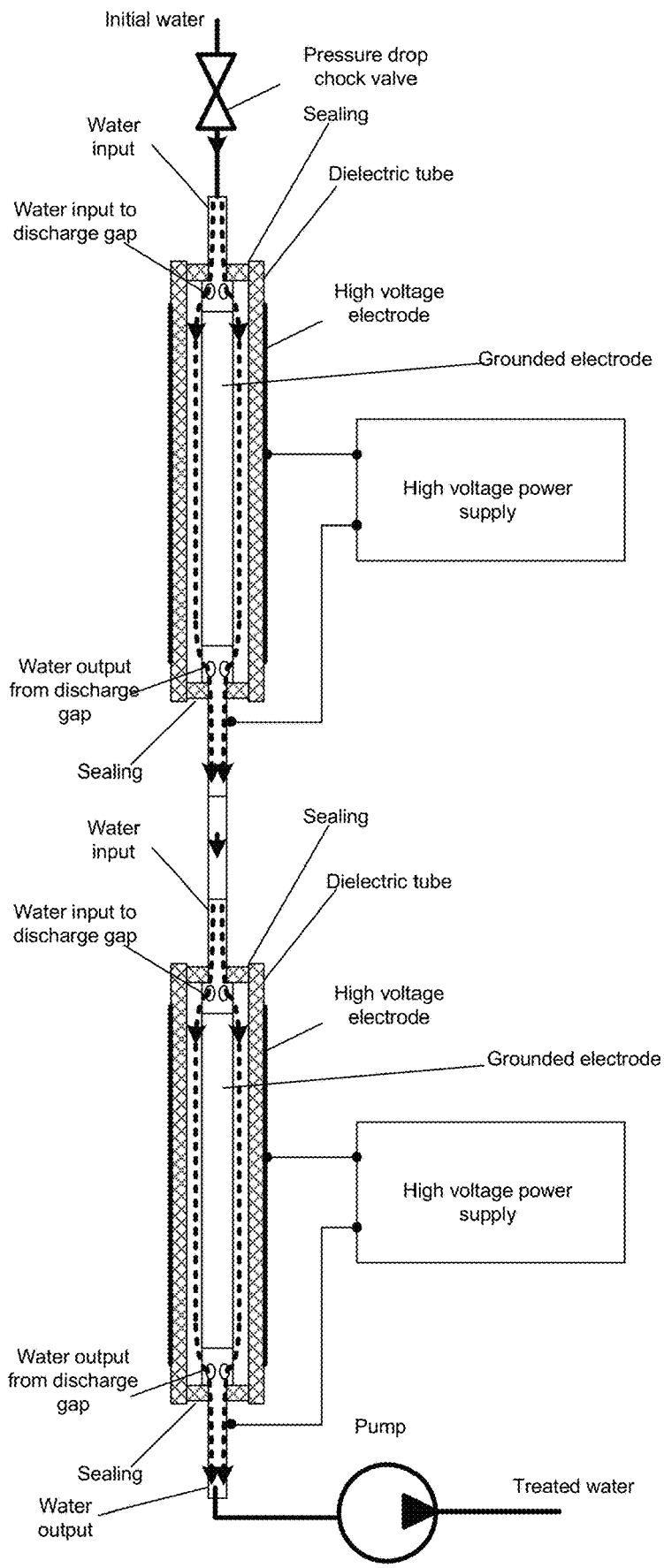
FIG. 9 shows two reactors arranged in series.

Another option is using of several reactors installed in parallel (FIG. 4) or in series (FIG. 9) to increase reactor capacity up to any desirable value.

Experimental Example 1—Experimental Oxidation of Easy Oxidative Organic Admixtures As a model, strong organic colorant Bis-(p-diethylamino) triphenyl anhydrocarbinol oxalate was chosen. Colorant was added to distillated water with small amounts of sulfuric acid or sodium hydroxide for pH control in region from 5 to 9. In the entire pH region, effective oxidation of colorant and complete water decolorization has been demonstrated. Power supply frequency was 30 kHz and voltage on electrodes oscillated from −3 kV to +3 kV. Colorant molecule oxidation energy cost was about 40 eV per molecule, which is close to the energy cost of oxidation by ozone and acceptable for practical applications.

Experimental Example 2—Experimental Oxidation of Hard Oxidative Inorganic Admixtures As a model, ammonia solution in distillated water was chosen as an example of hard oxidative admixture which cannot be oxidized by traditional technologies (by ozone, for example). Ammonia concentration was varied in region 0.5-5 g/m3. In the entire pH region, effective oxidation of ammonia (ammonia concentration decrease more than in ten times) has been demonstrated. Power supply frequency was 3 kHz and voltage on electrodes oscillated from −3 kV to +3 kV. Ammonia molecule oxidation energy cost was about 30 eV per molecule. Ammonia oxidation is a result that cannot be accomplished by conventional methods and oxidants (such as ozone).

Experimental Example 3—Experimental Synthesis of Hydrogen Peroxide in Water

In experiments distillated water was treated by described reactor according to the flow diagram shown in FIG. 2. Power supply frequency was 30 kHz and voltage on electrodes oscillated from −3 kV to +3 kV. For each 30 seconds of treatment time, concentration of generated hydrogen peroxide was measured. Effective hydrogen peroxide generation with linear dependence on treatment time and power input to plasma was demonstrated. Hydrogen peroxide molecule generation energy cost was about 40 eV per molecule. This energy cost is close to total (including accompanying energy expenditures like air or oxygen preparation and reactor cooling) energy cost of ozone generation and is acceptable for practical applications of generated hydrogen peroxide.

Experimental Example 4—Experimental Cracking of Hexane

In experiments chemical grade hexane was treated by described reactor according to the flow diagram shown in FIG. 2. Power supply frequency was 30 kHz and voltage on electrodes oscillated from −2 kV to +2 kV. Every 5 minutes of treatment time, a sample for chemical analysis was taken. Also, gas samples were taken from gas bubbles generated after the reactor. In gas bubbles methane was measured with small admixtures of propane and hydrogen. In liquid samples of hexane some admixture of benzene was detected with the concentration increasing during treatment time. This way, the hexane cracking process was detected with an energy cost about 10 eV per molecule. This energy cost is compatible with a bound energy in hexane and demonstrates good cracking efficiency.

Figure 8:
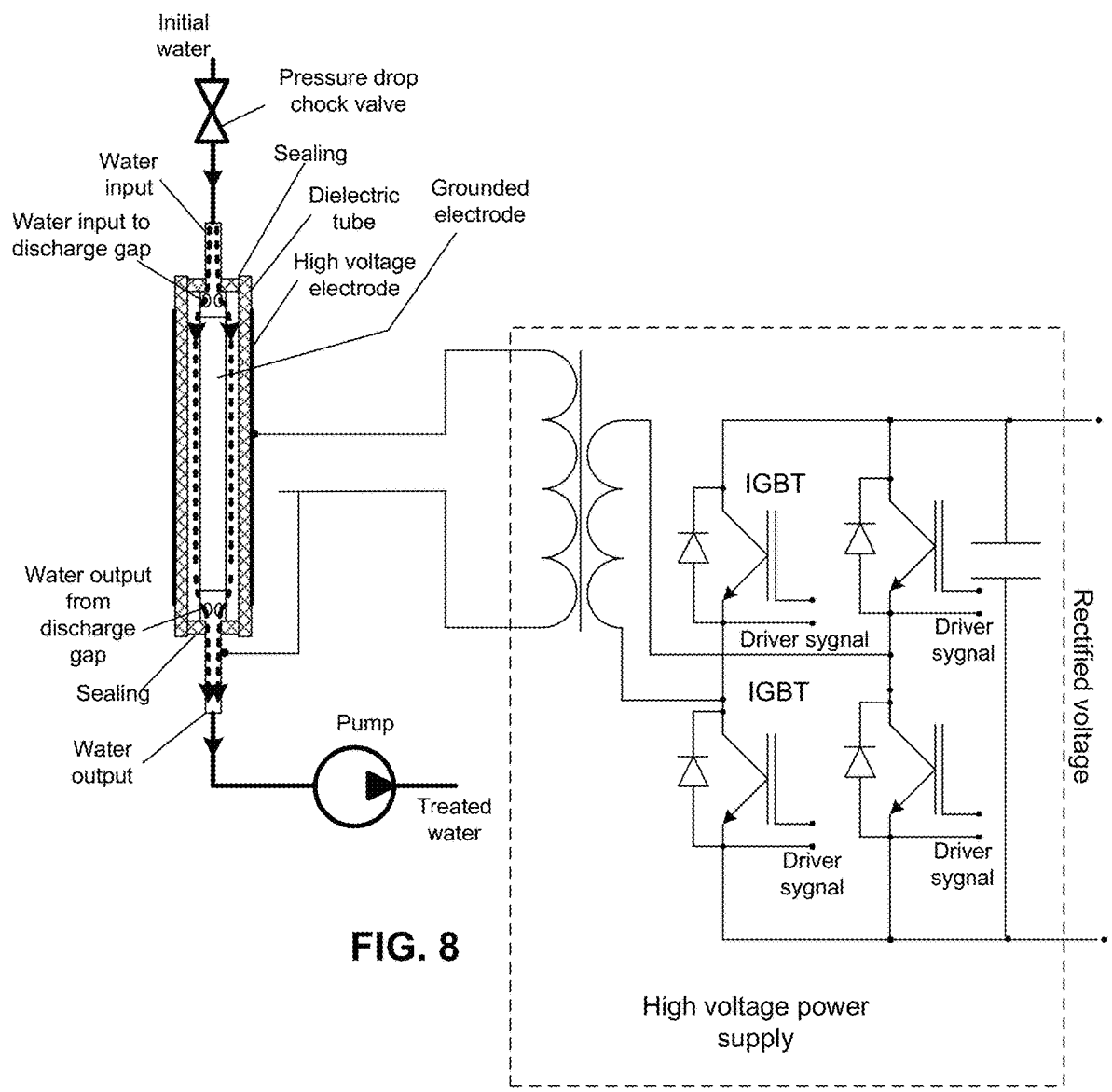
FIG. 8 shows an exemplary power supply based on full-wave push-pull schematic with IGBT bridge.

FIG. 5-FIG. 8 show an exemplary power supplies that can be used in the invention. Power supplies are based on high frequency high voltage transformer with several versions, including an inverter based on a half-wave fly-back schematic (FIG. 5), an inverter based on a full-wave push-pull schematic with IGBT semi bridge (FIG. 6), an inverter based on a full-wave push-pull schematic with IGBT semi-bridge and midpoint transformer primary winding (FIG. 7), and an inverter based on a full-wave push-pull schematic with IGBT bridge (FIG. 8). FIG. 8 shows an exemplary power supply based on full-wave push-pull schematic with an IGBT bridge.

Having thus described a preferred embodiment, it should be apparent to those skilled in the art that certain advantages of the described method and apparatus have been achieved.

It should also be appreciated that various modifications, adaptations and alternative embodiments thereof may be made within the scope and spirit of the present invention. The invention is further defined by the following claims. The entire disclosures of all patents and publications cited above are hereby incorporated by reference.

What is claimed is:

1. A system for generation of radicals in a liquid by a plasma reactor, comprising:
   a first electrode having a rod shape or a tubular shape;
   a dielectric tubular housing coaxial with the first electrode and enclosing the first electrode, and having a gap to the first electrode of 0.3-30 mm;
   a second electrode on an outside of the dielectric tubular housing and coaxial with first electrode with a gap 0.3-30 mm;

a high voltage power supply providing voltage oscillations or pulses of 0.5-30 kV between the first and second electrodes with a frequency 1-50 kHz; and a pump or a Venturi injector on an output of the plasma reactor and a chock valve on an input of reactor for generating a low water pressure in the gap between first and second electrodes so as to generate boiling in the gap.

2. The system of claim 1, wherein the input and the output of the plasma reactor is directed tangentially.

3. The system of claim 1, wherein the first electrode has sharp ridges on its outer surface to distribute plasma inhomogeneities.

4. The system of claim 1, wherein the first electrode has a thread on its outer surface to distribute plasma inhomogeneities.

5. The system of claim 1, wherein multiple plasma reactors are connected in parallel.

6. The system of claim 1, wherein multiple plasma reactors are connected in series.

7. The system of claim 1, wherein the liquid is water.

8. The system of claim 1, wherein the radicals are OH radicals.

9. The system of claim 1, wherein the plasma reactor also generates hydrogen peroxide ($H_2O_2$).

10. The system of claim 1, wherein the second electrode is shaped as a wire spiral, a metal grid, a metal foil or a metal tubular shape.

* * * * *